(12) United States Patent
Akino

(10) Patent No.: US 9,590,570 B2
(45) Date of Patent: Mar. 7, 2017

(54) IMPEDANCE CONVERTER CIRCUIT FOR CONDENSER MICROPHONE

(71) Applicant: KABUSHIKI KAISHA AUDIO-TECHNICA, Machida-shi, Tokyo (JP)

(72) Inventor: Hiroshi Akino, Machida (JP)

(73) Assignee: KABUSHIKI KAISHA AUDIO-TECHNICA, Machida-Shi, Tokyo (JP)

( * ) Notice: Subject to any disclaimer, the term of this patent is extended or adjusted under 35 U.S.C. 154(b) by 0 days.

(21) Appl. No.: 14/946,269

(22) Filed: Nov. 19, 2015

(65) Prior Publication Data

US 2016/0156321 A1    Jun. 2, 2016

(30) Foreign Application Priority Data

Nov. 28, 2014  (JP) .................. 2014-241573

(51) Int. Cl.
| | | |
|---|---|---|
| *H03F 1/56* | (2006.01) | |
| *H04R 3/06* | (2006.01) | |
| *H03F 5/00* | (2006.01) | |
| *H04R 19/04* | (2006.01) | |

(52) U.S. Cl.
CPC ................. *H03F 1/56* (2013.01); *H03F 5/00* (2013.01); *H04R 3/06* (2013.01); *H03F 2200/03* (2013.01); *H04R 19/04* (2013.01)

(58) Field of Classification Search
CPC .......... H03F 1/56; H03F 5/00; H03F 2200/03; H04R 3/06; H04R 19/04
See application file for complete search history.

(56) References Cited

U.S. PATENT DOCUMENTS

| | | | | |
|---|---|---|---|---|
| 4,918,394 A | * | 4/1990 | Modafferi | H03F 5/00 330/118 |
| 5,912,585 A | * | 6/1999 | Yamada | H03F 3/181 330/118 |

FOREIGN PATENT DOCUMENTS

| | | |
|---|---|---|
| JP | 3890301 B2 | 3/2007 |
| JP | 4426902 B2 | 3/2010 |

* cited by examiner

*Primary Examiner* — Ping Lee
(74) *Attorney, Agent, or Firm* — Manabu Kanesaka

(57) ABSTRACT

To provide an impedance converter circuit for a condenser microphone which can secure a wide dynamic range using a voltage amplifier circuit. The impedance converter circuit is provided with: a first electron tube of a cathode grounded type in which an output signal of a condenser microphone unit is input into a grid and output from a plate; a second electron tube in which an output signal from the plate of the first electron tube is input into a grid and output from at least a cathode; and a feedback element configured to transmit a feedback signal from the cathode of the second electron tube to the grid of the first electron tube.

5 Claims, 4 Drawing Sheets

IMPEDANCE CONVERTER CIRCUIT FOR CONDENSER MICROPHONE

RELATED APPLICATIONS

The present application is based on, and claims priority from, Japanese Application No. JP2014-241573 filed Nov. 28, 2014, the disclosure of which is hereby incorporated by reference herein in its entirety.

BACKGROUND OF THE INVENTION

Field of the Invention

The present invention relates to an impedance converter circuit for a condenser microphone which utilizes an electron tube (vacuum tube).

Description of the Related Art

A condenser microphone generates an audio signal on the basis of a change in capacitance between a diaphragm and a fixed electrode which face each other.

That is, a condenser microphone wherein a diaphragm is located to face a fixed electrode has capacitance of around several tens of pF, and consequently the output impedance becomes extremely high. Such a condenser microphone therefore has a configuration such that an audio signal is extracted via an impedance converter circuit.

For such a condenser microphone, an impedance converter circuit which includes a field effect transistor (FET) or an electron tube (vacuum tube) is used. In particular, for a condenser microphone to be used for sound collection in a studio, a product is provided which uses an electron tube in an impedance converter circuit in order to improve the sound quality.

Impedance converter circuits which use electron tubes include a current amplifier circuit, which is called a plate grounded type or a cathode follower circuit, and a voltage amplifier circuit of a cathode grounded type.

In the case where a cathode follower circuit is used as an impedance converter circuit, it is generally known that a tone close to a condenser microphone which uses an FET described above is obtained.

On the other hand, a condenser microphone which uses a voltage amplifier circuit described above in an impedance converter circuit has a unique tone referred to as "vacuum tube like sound", which is different from that of a cathode follower circuit. Such a tone still remains popular.

The former cathode follower circuit provides a wide dynamic range (range from a noise level to a level where distortion occurs). However, distortion occurs in the latter voltage amplifier circuit at a lower signal level than a cathode follower circuit. Therefore, a maximum allowable input sound pressure level as a microphone lowers when a voltage amplifier circuit is used in an impedance converter circuit. Accordingly, it is desired to use a voltage amplifier circuit including a vacuum tube as an impedance converter circuit for a condenser microphone so as to secure a wide dynamic range.

Now, in order to widen the dynamic range of the impedance converter circuit which uses a voltage amplifier circuit, means for applying negative feedback can be employed. That is, by connecting a condenser between a plate and a grid of an inverting amplifier which uses an electron tube, a signal generated by the plate can be fed back to the grid since a signal source is of a capacitance type (condenser).

This is called PG feedback, and impedance converter circuits wherein such PG feedback is conducted are disclosed in Japanese Patent No. 3,890,301 and Japanese Patent No. 4,426,902, for example.

FIG. 1 illustrates an example of an impedance converter circuit wherein PG feedback is conducted. In this example, a condenser Cp is connected as a feedback element between a plate and a grid of a voltage amplifier tube denoted by T1.

It is to be noted that the entire circuit configuration of the example illustrated in FIG. 1 excluding the configuration of a feedback circuit is the same as that of an embodiment according to the present invention which will be described below. Accordingly, detailed description on the entire circuit will be given below with reference to FIG. 2.

The plate of the electron tube T1 which constitutes a voltage amplifier has high impedance. Therefore, there is a limit on endeavor to increase a feedback quantity with the configuration of the PG feedback circuit illustrated in FIG. 1 in order to widen the above-described dynamic range.

That is, even when a feedback element having low impedance is used to increase the feedback quantity, a sufficient feedback quantity cannot be obtained since this becomes equivalent to series connection of impedance of the feedback element Cp with output impedance of the plate of the electron tube T1. Accordingly, a limit arises in circuit designing.

In order to solve such a problem, it is required to connect a feedback element with a signal source having low output impedance.

SUMMARY OF THE INVENTION

The present invention has been made based on the above-described technical viewpoints, and has an object to provide an impedance converter circuit for a condenser microphone which can secure a wide dynamic range using a voltage amplifier circuit by applying a feedback signal to a grid of an initial-stage voltage amplifier tube from a point of sufficiently low output impedance.

An impedance converter circuit for a condenser microphone according to the present invention made with the aim of solving the above-described issues includes: a first electron tube of a cathode grounded type in which an output signal of a condenser microphone unit is input into a grid and output from a plate; a second electron tube in which an output signal from the plate of the first electron tube is input into a grid and output from at least a cathode; and a feedback element configured to transmit a feedback signal from the cathode of the second electron tube to the grid of the first electron tube.

In such a case, the feedback element is desirably constituted of a condenser element.

Besides, a configuration can be suitably employed wherein the second electron tube constitutes a PK division circuit in which a plate and the cathode of the second electron tube are respectively connected with load resistances and provide signals having phases reverse to each other, which are output as balanced output signals of a condenser microphone.

In addition, the first and second electron tubes are preferably constituted of a triode electron tube.

With the above-described impedance converter circuit for a condenser microphone according to the present invention, a voltage amplifier circuit is constituted of the first electron tube of a cathode grounded type. This can provide an audio signal having a tone peculiar to a voltage amplifier circuit which includes an electron tube.

Besides, with the structure wherein a feedback signal is transmitted from the cathode of the second electron tube having low output impedance via the feedback element to the grid of the first electron tube, it is possible to increase the feedback quantity using the feedback element having low impedance.

This can provide an impedance converter circuit for a condenser microphone which secures a wide dynamic range using a voltage amplifier circuit.

DESCRIPTION OF THE PREFERRED EMBODIMENTS

Figure 1:
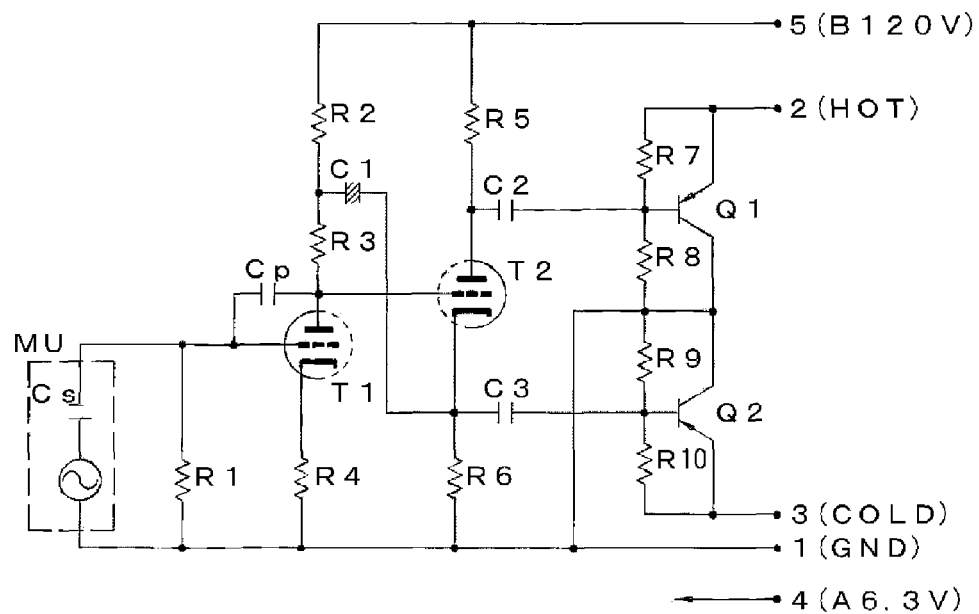
FIG. 1 is a circuit configuration diagram illustrating an example of an impedance converter circuit for a condenser microphone which uses a conventional PG feedback circuit.

An impedance converter circuit for a condenser microphone according to the present invention will hereinafter be described with reference to FIG. 2.

The symbol MU denotes a condenser microphone unit with an equivalent circuit. This is represented as series connection of a condenser Cs with a signal source. That is, the condenser Cs corresponds to capacitance between a fixed electrode and a diaphragm which compose the condenser microphone unit, and has a capacity of around several tens of pF as described above.

In addition, one end of the condenser microphone unit MU is connected with a grid of a first electron tube T1, and the other end is connected with a terminal pin 1 of a connector as a ground line.

A grid leak resistance R1 is connected between the grid of the first electron tube T1 and the ground line. Moreover, a plate of the first electron tube T1 is connected with a load resistance constituted of a series circuit of resistances R2 and R3. Moreover, the load resistance R2 is connected with a terminal pin 5 of a connector which receives power supply from a direct current operated power source (B power source).

Furthermore, a cathode resistance R4 is connected between a cathode of the first electron tube T1 and the ground line. This allows the first electron tube T1 to constitute a voltage amplifier circuit of a cathode grounded type.

The plate of the first electron tube T1 is connected with a grid of a second electron tube T2 which composes a triode electron tube together with the first electron tube T1. In addition, a load resistance R5 is connected between a plate of the second electron tube T2 and the terminal pin 5, so that the plate of the second electron tube T2 is connected with the B power source via the load resistance R5. Moreover, a load resistance R6 is connected between a cathode of the second electron tube T2 and the ground line.

The value of the load resistance R5 and the value of the load resistance R6 are set to be substantially equal to each other. This allows signals having phases reverse to each other and substantially equal levels to be output to the plate and the cathode of the second electron tube T2. That is, the second electron tube T2 and components around the second electron tube T2 (load resistances R5 and R6) compose a PK division circuit. Accordingly, the PK division circuit makes it possible to obtain a balanced output signal of a condenser microphone.

On the other hand, a feedback element constituted of a condenser Ck is connected between the cathode of the second electron tube T2 and the grid of the first electron tube T1. This allows the first electron tube T1 to act as a voltage amplifier circuit having a grid to which negative feedback is applied.

In such a case, the cathode of the second electron tube T2 has low output impedance. It is therefore possible to apply a sufficient quantity of negative feedback to the voltage amplifier circuit constituted of the first electron tube T1 by suitably selecting the capacitance of the condenser Ck acting as a feedback element.

That is, the impedance of the feedback path becomes substantially only the condenser Ck, since the output impedance of the cathode of the second electron tube T2 is sufficiently low. This allows the circuit to operate stably.

Moreover, a condenser C1 is connected between the cathode of the second electron tube T2 and a connection midpoint of the resistances R2 and R3 which are load resistances on the plate side of the first electron tube T1.

The condenser C1 gives a signal, which has the same phase as that of a signal at the plate of the first electron tube T1, to the connection midpoint of the resistances R2 and R3. This allows the first electron tube T1 to constitute a bootstrap circuit.

Direct current blocking condensers C2 and C3 are connected respectively with the plate and the cathode of the second electron tube T2. Balanced output signals of the condenser microphone are supplied to base electrodes of transistors Q1 and Q2 via the direct current blocking condensers C2 and C3.

The transistors Q1 and Q2 respectively constitute emitter follower circuits, and the respective collector electrodes are respectively connected with the ground line.

In addition, a first emitter follower circuit including the transistor Q1 is provided with bias set resistances R7 and R8. The emitter electrode of the transistor Q1 is connected as an output terminal on the hot side with a terminal pin 2 of the connector.

Similarly, a second emitter follower circuit including the transistor Q2 is provided with bias set resistances R9 and Rio. The emitter electrode of the transistor Q2 is connected as an output terminal on the cold side with a terminal pin 3 of the connector.

The terminal pins 2 and 3 of the connector are supplied with DC power from a phantom power source or a mixer circuit (not illustrated). The first and second emitter follower circuits are operated by DC power supplied to the terminal pins 2 and 3.

It is to be noted that a terminal pin 4 of the connector receives power supply from a heater power source (A power source) of the first and second electron tubes T1 and T2 (triode electron tube).

FIGS. 3 to 7 are characteristic charts obtained by comparing frequency response characteristics and total harmonic distortion against an input level of an impedance converter circuit for a condenser microphone according to the present invention with those of a conventional technique.

Figure 3:
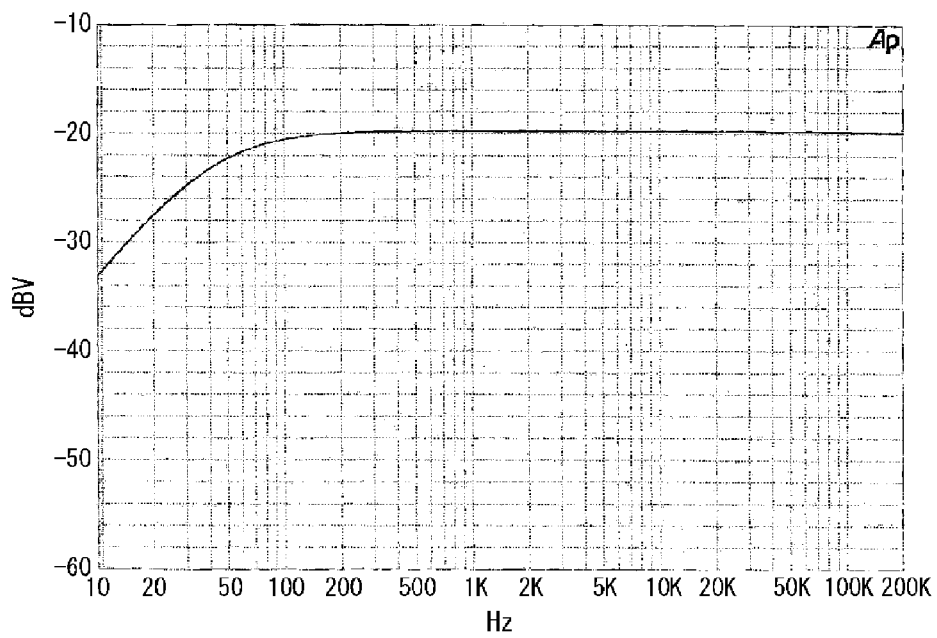
FIG. 3 is a frequency response characteristic chart of a case where a feedback circuit is not used.

First, FIG. 3 illustrates frequency response characteristics of a case where the feedback element Cp in the circuit configuration illustrated in FIG. 1 does not exist, that is, raw characteristics of a voltage amplifier which includes no feedback circuit. Regarding the characteristics illustrated in FIG. 3, a large drop is found in a low frequency range.

Figure 4:
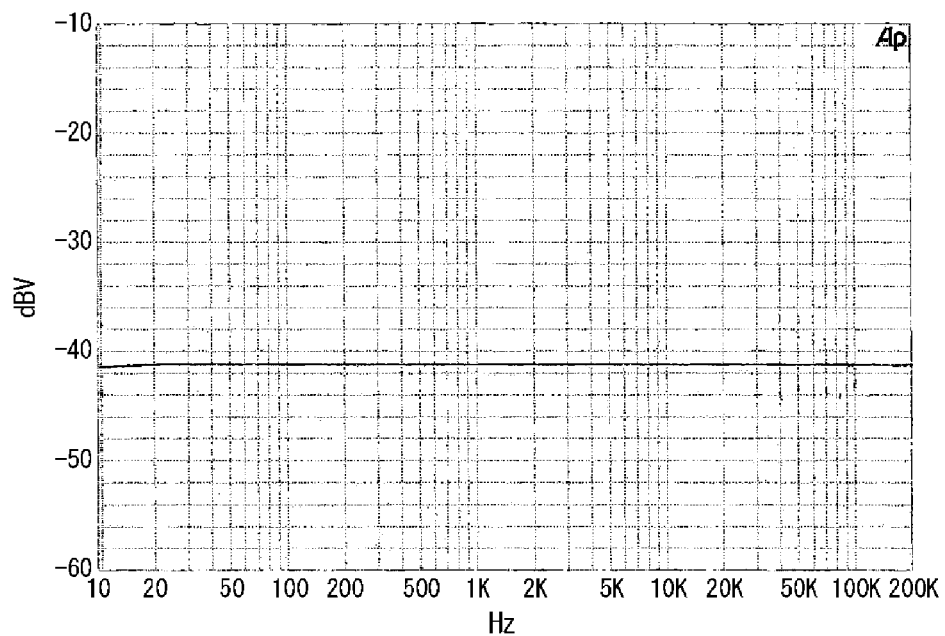
FIG. 4 is a frequency response characteristic chart of a case where a conventional PG feedback circuit is used.

FIG. 4 illustrates frequency response characteristics of the circuit configuration illustrated in FIG. 1 wherein the voltage amplifier tube T1 is provided with the feedback element Cp. In this example, a capacity of 56 pF is used as the condenser Cp acting as a PG feedback element. This is set at a value substantially equal to the capacitance Cs of the condenser microphone unit MU.

According to the characteristics illustrated in FIG. 4, the drop in the low range illustrated in FIG. 3 is not found though the total gain lowers, and overall flat frequency response characteristics can be obtained.

Figure 2:
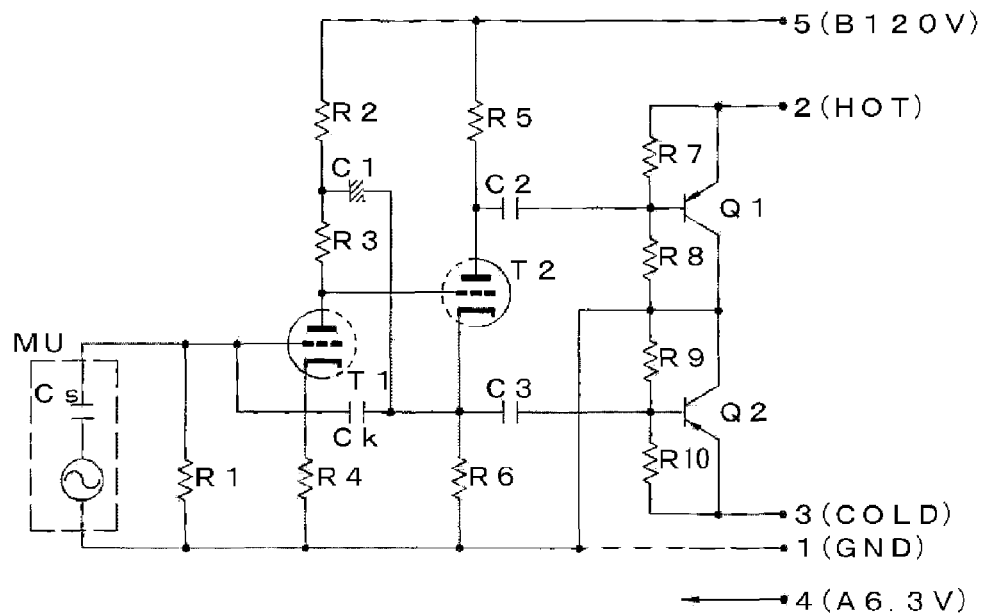
FIG. 2 is a circuit configuration diagram illustrating an example of an impedance converter circuit for a condenser microphone according to the present invention.
Figure 5:
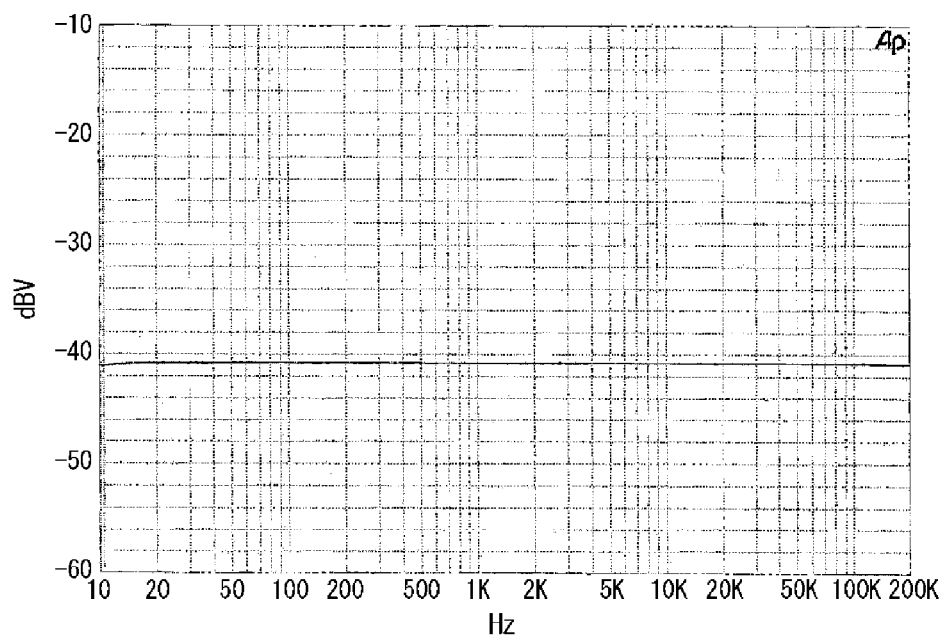
FIG. 5 is a frequency response characteristic chart of a case where a feedback circuit according to the present invention is used.

FIG. 5 illustrates frequency response characteristics of a circuit configuration according to the present invention illustrated in FIG. 2. In the example illustrated in FIG. 5, a capacity of 56 pF is used as the feedback element Ck. This is set at a value substantially equal to the capacitance Cs of the condenser microphone unit MU as described above.

According to the characteristics illustrated in FIG. 5, the drop in the low range illustrated in FIG. 3 is not found though the total gain lowers, and overall flat frequency response characteristics can be obtained.

That is, regarding comparison of frequency response characteristics, a conventional impedance converter circuit which uses PG feedback illustrated in FIG. 1 and an impedance converter circuit according to the present invention illustrated in FIG. 2 compare favorably with each other.

Figure 6:
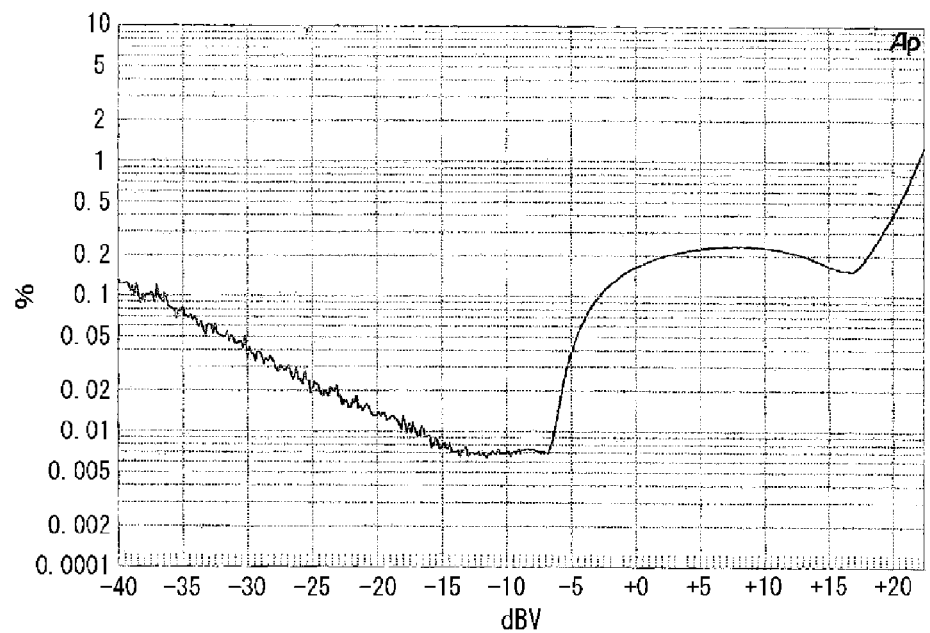
FIG. 6 is a characteristic chart illustrating total harmonic distortion against an input level of a case where a conventional PG feedback circuit is used.
Figure 7:
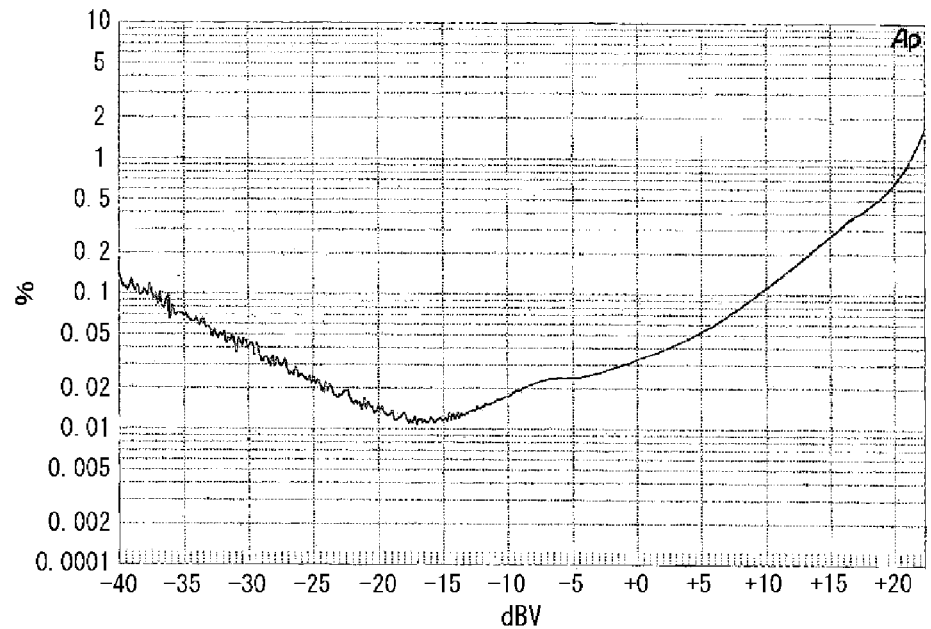
FIG. 7 is a characteristic chart illustrating total harmonic distortion against an input level of a case where a feedback circuit according to the present invention is used.

Now, comparison of characteristics indicating total harmonic distortion against an input level of the conventional impedance converter circuit illustrated in FIG. 1 and the impedance converter circuit according to the present invention illustrated in FIG. 2 is illustrated in FIGS. 6 and 7.

That is, regarding the conventional impedance converter circuit which uses PG feedback illustrated in FIG. 1, total harmonic distortion increases sharply at an input exceeding −7 dBV as illustrated in FIG. 6. Therefore, a phenomenon happens that a sound quality changes suddenly with an increase in a sound pressure input into the microphone.

On the contrary, regarding the impedance converter circuit according to the present invention illustrated in FIG. 2, characteristics are shown that total harmonic distortion increases gradually with an increase in an input level as illustrated in FIG. 7.

Accordingly, regarding an impedance converter circuit according to the present invention, occurrence of sudden change in sound quality can be prevented even when the sound pressure input into the microphone increases, and it becomes possible to provide an impedance converter circuit for a condenser microphone having a wide dynamic range.

What is claimed is:

1. An impedance converter circuit for a condenser microphone, comprising:
    a first electron tube of a cathode grounded type in which an output signal of a condenser microphone unit is input into a grid and output from a plate;
    a second electron tube in which an output signal from the plate of the first electron tube is input into a grid and output from at least a cathode; and
    a feedback element configured to transmit a feedback signal from the cathode of the second electron tube to the grid of the first electron tube.

2. The impedance converter circuit for a condenser microphone according to claim 1, wherein the feedback element is constituted of a condenser element.

3. The impedance converter circuit for a condenser microphone according to claim 2, wherein the second electron tube constitutes a PK division circuit in which a plate and the cathode of the second electron tube are respectively connected with load resistances and provide signals having phases reverse to each other, which are output as balanced output signals of a condenser microphone.

4. The impedance converter circuit for a condenser microphone according to claim 1, wherein the second electron tube constitutes a PK division circuit in which a plate and the cathode of the second electron tube are respectively connected with load resistances and provide signals having phases reverse to each other, which are output as balanced output signals of a condenser microphone.

5. The impedance converter circuit for a condenser microphone according to claim 1, wherein the first and second electron tubes are constituted of a triode electron tube.

* * * * *